United States Patent
Ziegler et al.

(10) Patent No.: US 8,742,516 B2
(45) Date of Patent: Jun. 3, 2014

(54) HF-MEMS SWITCH

(75) Inventors: Volker Ziegler, Neubiberg (DE);
Bernhard Schönlinner, München (DE);
Ulrich Prechtel, Munich (DE); Armin Stehle, Neu-Ulm (DE)

(73) Assignee: EADS Deutschland GmbH, Ottobrunn (DE)

( * ) Notice: Subject to any disclaimer, the term of this patent is extended or adjusted under 35 U.S.C. 154(b) by 515 days.

(21) Appl. No.: 13/052,699

(22) Filed: Mar. 21, 2011

(65) Prior Publication Data

US 2011/0233691 A1  Sep. 29, 2011

(30) Foreign Application Priority Data

Mar. 24, 2010  (DE) .......................... 10 2010 012 607

(51) Int. Cl.
*H01L 29/84*  (2006.01)

(52) U.S. Cl.
CPC ......... *H01L 29/84* (2013.01); *B81B 2203/0118* (2013.01)
USPC ........................................................ 257/415

(58) Field of Classification Search
CPC ................ H01L 29/84; B81B 2201/01; B81B 2203/0118; B81B 2203/053
USPC .................. 257/414–415, 417, 420, E27.006; 438/48, 50–52
See application file for complete search history.

(56) References Cited

U.S. PATENT DOCUMENTS

| | | | | |
|---|---|---|---|---|
| 4,596,992 A | * | 6/1986 | Hornbeck | 347/134 |
| 4,956,619 A | * | 9/1990 | Hornbeck | 359/317 |
| 5,028,939 A | * | 7/1991 | Hornbeck et al. | 347/131 |
| 5,417,111 A | * | 5/1995 | Sherman et al. | 73/514.32 |
| 5,619,050 A | * | 4/1997 | Uenoyama et al. | 257/254 |
| 5,620,931 A | * | 4/1997 | Tsang et al. | 438/50 |
| 5,628,663 A | | 5/1997 | Potter | |
| 5,969,250 A | * | 10/1999 | Greiff | 73/514.38 |
| 2002/0124385 A1 | * | 9/2002 | Tsai et al. | 29/622 |
| 2004/0076008 A1 | * | 4/2004 | Ikeda | 362/259 |
| 2005/0032266 A1 | * | 2/2005 | Suzuki | 438/50 |
| 2007/0037311 A1 | * | 2/2007 | Izumi et al. | 438/53 |
| 2007/0215966 A1 | | 9/2007 | Ikegami | |
| 2008/0017489 A1 | | 1/2008 | Kawakubo et al. | |
| 2009/0174014 A1 | | 7/2009 | Kunze et al. | |
| 2009/0238515 A1 | * | 9/2009 | Fattal et al. | 385/30 |

FOREIGN PATENT DOCUMENTS

DE   102004062992 A1   7/2006

OTHER PUBLICATIONS

Pillans, Brandon, et al., "Schottky Contact RF MEMS Switch Characterization", Proc. IEEE Int. Microw. Symp. 2007, S 379-382.
Iannicci, J., et al., "A General Purpose Reconfigurable MEMS-Based Attenuator for Radio Frequency and Microwave Applications", EURO-CON 2009, IEEE, May 18-23, 2009, S 1197-1205.

* cited by examiner

*Primary Examiner* — Michele Fan
(74) *Attorney, Agent, or Firm* — Hoffmann & Baron, LLP

(57) ABSTRACT

A high frequency-MEMS switch with a bendable switching element, whose one end is placed on a high resistivity substrate provided with an insulator, furthermore with a contact electrode to supply charge carriers to the substrate, wherein an electrical field can be produced to create an electrostatic bending force on the switching element between the switching element and the substrate, wherein at least one implantation zone is formed in the substrate, essentially directly beneath the insulator, the implantation zone is contacted with the contact electrode, which is located above the insulator, through an opening in the insulator, and also has ohmic contact with the substrate.

6 Claims, 2 Drawing Sheets

HF-MEMS SWITCH

CROSS-REFERENCE TO RELATED APPLICATION

This application claims priority to German patent application DE 10 2010 012 607.1 filed on Mar. 24, 2010, which is incorporated herein by reference in its entirety.

TECHNICAL FIELD

The application relates generally to high frequency-MEMS switches. More specifically, the application is directed to a high frequency-MEMS switch with a bendable switching element, whose one end is placed on a high resistivity substrate provided with an insulator, also with a contact electrode for the supply of charge carriers into the substrate, wherein between the switching element and the substrate, an electrical field can be produced in order to create an electrostatic bending force on the switching element.

BACKGROUND

MEMS switches (MEMS=Micro Electromechanical Systems) are used in different areas, in particular, automobile electronics, telecommunications, medical technology, or measurement technology. As a result of their miniaturization, such switching elements, developed as microelectromechanical systems, are also particularly suitable for space travel applications and satellite systems. High frequency-MEMS switches are also used, in particular, in radar systems, satellite communications systems, wireless communications systems, and instrument systems. Examples of this are phased antenna systems and phase shifters for satellite-based radar systems.

High frequency-MEMS switches offer a number of advantages, such as, in particular, a very low current consumption, a good insulation or low stray capacitance, a low insertion dampening or low insertion losses, and low production costs.

DE 10 2004 062 992 A1 discloses a high frequency-MEMS switch. This switch consists of a high resistivity substrate, on whose one side an electrode is provided as a ground electrode. An insulation layer is placed on the opposite side of the substrate; on it, a bent switching element is affixed with the one end, whereas the opposite free end is located in a position bent away from the substrate. If a voltage is applied between the switching element and the ground electrode, then an electrical field is formed essentially between the substrate below the insulation layer and the switching element; the field attracts the bent section of the switching element and is thereby bent straight toward the substrate surface. When the bendable switching element approaches the insulation layer, capacitive coupling takes place between the switching element and a signal conductor which is then opposite it, which represents the actual switching process. In the described, previously known model, this signal conductor is located on the insulation layer; it can, however, also be constructed as an implantation area that is designed below the insulation layer within the substrate, which is contacted toward the outside.

The switching times of such high frequency-MEMS switches are limited by electrical and mechanical effects. For many applications in communications or radar systems, shorter switching times are desirable. As a result of the correlation with the high frequency characteristics of the switches, the mechanical effects cannot be arbitrarily improved. The switching time results thereby from the sum of the mechanical switching time and the electrical switching time, wherein the latter is proportional to the reciprocal value from the product of the lead resistance with the capacitance of the MEMS structure (1(R×C)).

Often, the geometrical dimensions of the HF-MEMS switches and their switching elements (cantilever structures) are optimized, in order to shorten their mechanical switching time. Moreover, overvoltages (actuating voltages, which are significantly above the switching voltage) can be used, so as to further reduce the turn-on time, but not the turn-off time.

The electrical switching time, however, remains unaffected by these measures (namely the optimization of the geometrical dimensions of the HF-MEMS switches and switching elements). Only the electrical turn-on time can also be further reduced by overvoltages, which, however, promotes the accumulation of unwanted charge carriers at the upper edge of the insulator (sticking effect), which can render the MEMS switch unusable. Since the charge carriers must be brought to the underside of the insulation layer, the resistance of the lead, which is decisive for the electrical switching time, predominates due to the substrate resistance and the Schottky contact on the reverse side of the substrate. Typical values for this resistance are on the order of magnitude of 700 kΩ. Typical mechanical switching times are in the range of 8 μs to 100 μs. These vary depending on the applied actuating voltage. If it is too high in comparison to the switching voltage, then the switching times are short, since the cantilever structure is greatly accelerated in the direction of the substrate by a relatively large force. 8 μs represents the value for a high voltage and 100 μs, the value for a low voltage.

Typical electrical switching times, taking into consideration the capacitance on the order of magnitude of 50 pF, are in the range of 30 μs to 90 μs. Also, the electrical switching time fluctuates for small and large actuating voltages of the switch.

From the publications US 2009/0174014 A1 and US 2008/0017489 A1, MEMS high frequency switches with contacts near the surface are known.

The use of doped semiconductor layers under an insulation layer on a high resistivity substrate as the contact electrode is disclosed in the publication by B. Pillans et al., "Schottky contact RF MEMS switch characterization," Proc. IEEE Int. Microw. Symp., 2007, pages 379-382. In the publication by J. Iannacci et al.: "A general purpose reconfigurable MEMS-based attenuator for Radio Frequency and microwave applications," EUROCON 2009, IEEE, May 18-23, 2009, pages 1197-1205, a MEMS-high frequency switch is described with a polysilicon electrode doped by implantation under a thin insulator layer.

Buried contacts close to the surface of substrates of high frequency components are known from U.S. Pat. No. 5,628,663. The ohmic contacting of buried, implanted electrodes is also already known from US 2007/0215966 A1.

SUMMARY

Proceeding from the foregoing, the goal of this application is to make available a high frequency-MEMS switch, which is characterized by a shortened switching time.

This goal is attained in that at least one implantation zone, which is contacted by an opening in the insulator with the contact electrode located above the insulator and furthermore has an ohmic contact with the substrate, is constructed in the substrate directly beneath the insulator.

Advantageous refinements can be deduced from the subordinate claims.

The basic idea is to be found in the supplying of the ground potential, not as up to now from the reverse side of the substrate, but rather from the upper side, through an opening in the insulator, and making available an implantation area for the bringing about of an ohmic contact with the substrate beneath the insulator. Instead of a contacting of the substrate on the reverse side, the ground contact is therefore carried out via the front side. By bringing in at least one implantation zone with ohmic contacts to the high resistivity substrate, adjacent to or below the switching element, the electrical paths and thus the lead resistance and consequently also the electrical switching time are shortened. Moreover, the high-impedance Schottky diode, undefined in a polarity, between the reverse side contact and the substrate, is avoided. In this way, the resistance of the lead can be reduced, depending on the construction, in a precise and reproducible manner, to the individually desired order of magnitude of, for example, 50 kΩ, so that electrical switching times in the range of 2 to 40 μs are now possible with high actuating voltages. The use of at least one implantation zone for the ground contact of the substrate from the "front side" clearly shortens the electrical switching time and thus the total switching time. In this way, the application range of the HF-MEMS is clearly expanded.

In accordance with an advantageous refinement, the at least one implantation zone is laterally staggered relative to the switching element. This arrangement has the advantage of causing less HF loss than an arrangement directly under the switching element itself. However, this arrangement causes a higher resistance, in contrast to that in which the implantation is placed directly under the switching element.

Several implantation zones can also be provided, which can be placed at different positions—for example, on both sides of the switching element.

The implantation zone is advantageously formed by means of ion implantation.

An advantageous refinement provides for the placement of an implantation zone beneath the switching element, wherein there is the smallest possible lead resistance on an order of magnitude of about 50 kΩ, resulting in the shortest possible switching times.

In accordance with an advantageous refinement, the implantation zone ends before the movable end of the switching element—before a second implantation area, which is constructed beneath the movable switching element, so as to carry out the actual switching process as capacitive coupling, in collaboration with the movable switching element.

The implantation zone is produced by means of standard ion implantation, wherein the doping is selected in such a way that an ohmic contact with the substrate results. This is advantageously at least about 1 μm deep.

BRIEF DESCRIPTION OF THE DRAWINGS

The application is further explained below using preferred embodiments with reference to the appended drawings. The same reference symbols thereby designate the same parts. The figures show the following thereby.

DETAILED DESCRIPTION

Figure 1:
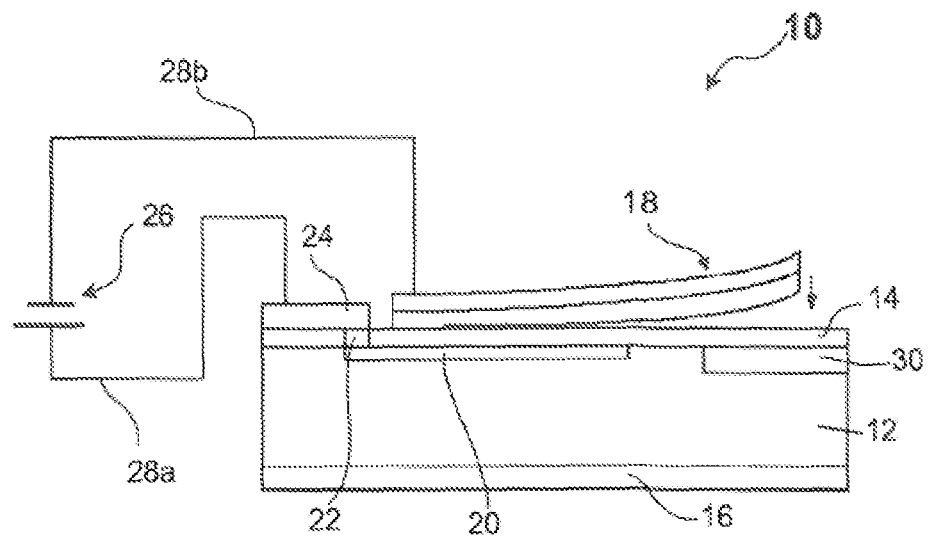
FIG. 1 is a schematic sectional view of a high frequency-MEMS switch.

FIG. 1 shows a schematic sectional view of a high frequency-MEMS switch 10, which is suitable for high frequency applications. This includes a high resistivity substrate 12, which is made, for example, of silicon. An insulation layer 14, for example, made of $SiO_2$ is provided in a thickness of about 100 nm to 500 nm on its front side. On the reverse side of the substrate 12, a reverse contact 16 is provided, via which, traditionally, the switch 10 was connected. Now this is used only for HF transmission by means of a microstrip line.

On the insulation layer 14, a bent switching element 18 is affixed with one end in the state at rest, whereas the free end of the insulation layer 14 stands out.

A first implantation zone 20 extends beneath the insulation layer 14; it is connected, in an electrically conductive manner, via an opening 22 in the insulation layer 14 with a first metal terminal contact 24.

A voltage source 26 is connected, via a conduit 28a, with the first terminal contact 24, and a conduit 28b, with the switching element 18.

Below the free end of the switching element 18, there is a second implantation zone 30, which contacts the signal conductor of the more extensive microstrip line via a connection which is not shown and when the switching element 18 approaches between this and the implantation zone 30, a capacitive coupling is formed.

By activation of the voltage source 26, charge carriers of one polarity arrive at the switching element 18 and those of the opposite polarity, via the conduit 28a, into the implantation zone 20 and from there, into the substrate 12, and bring about an electrostatic attraction, which, in this way, attracts and thereby stretches the switching element 18 in the direction of the substrate 12. When the switching element 18 approaches the second implantation zone 30, the actual switching process is realized via capacitive coupling. If the voltage source 26 is again turned off, then the electrostatic attraction is eliminated, and the switching element 18 is again moved back into the bent position at rest, wherein the switch is again "opened"—that is, the capacitive coupling is ended.

Figure 2:
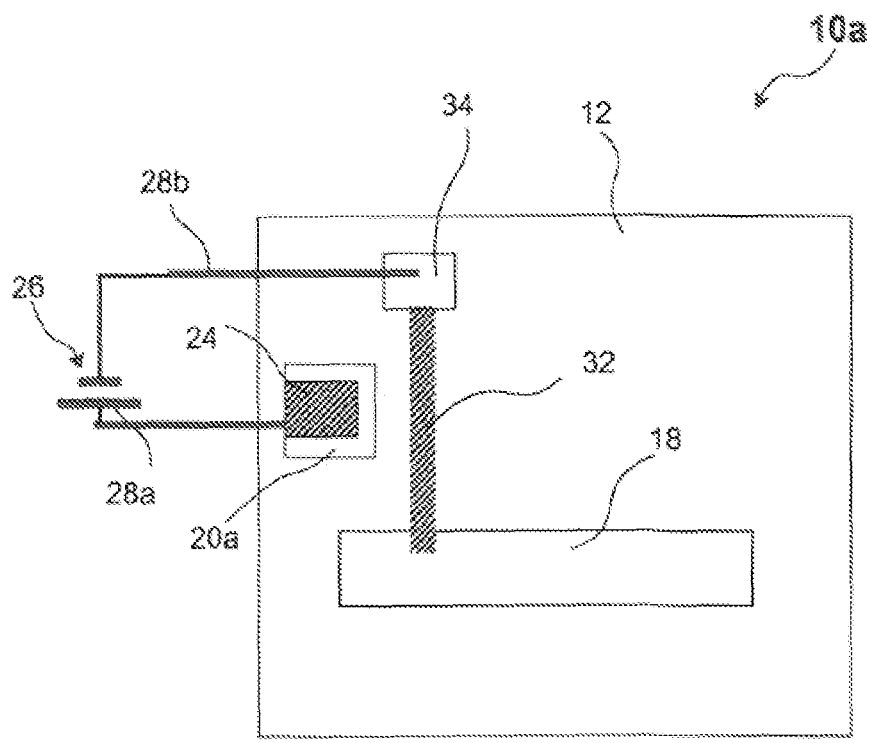
FIGS. 2 to 4 are top views of three different embodiments of high frequency-MEMS switches.

FIG. 2 shows a schematic top view of a first preferred embodiment of a high frequency-MEMS switch 10a, in which the implantation zone 20a is laterally staggered relative to the switching element 18. The switching element 18 is coupled with a second terminal contact 34 by means of a resistive conductor 32; the terminal contact 34 is in connection with the voltage source 26 via the conduit 28b. The second implantation zone is not shown in these figures.

Figure 3:
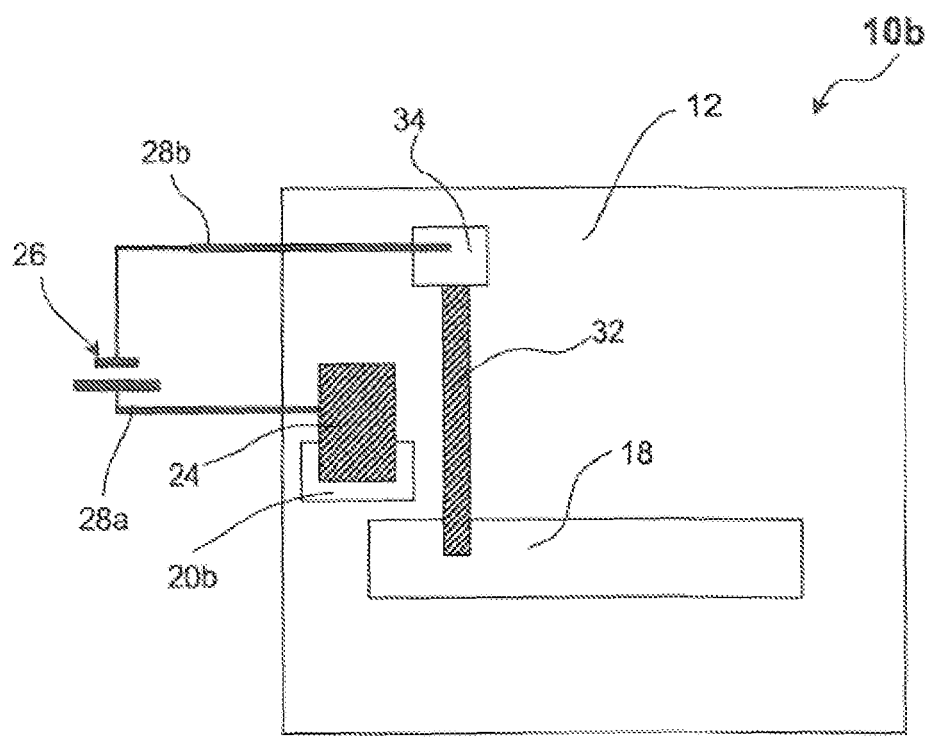

The embodiment in accordance with FIG. 3 is very similar to that of FIG. 2; only the implantation zone 20b lies closer to the switching element 18 than that of FIG. 2, wherein the electrical resistance is thus lower and the electrical switching time is shorter than in the embodiment in accordance with FIG. 2. This construction has the advantage that in contrast to FIG. 4, the HF losses are somewhat smaller.

Figure 4:
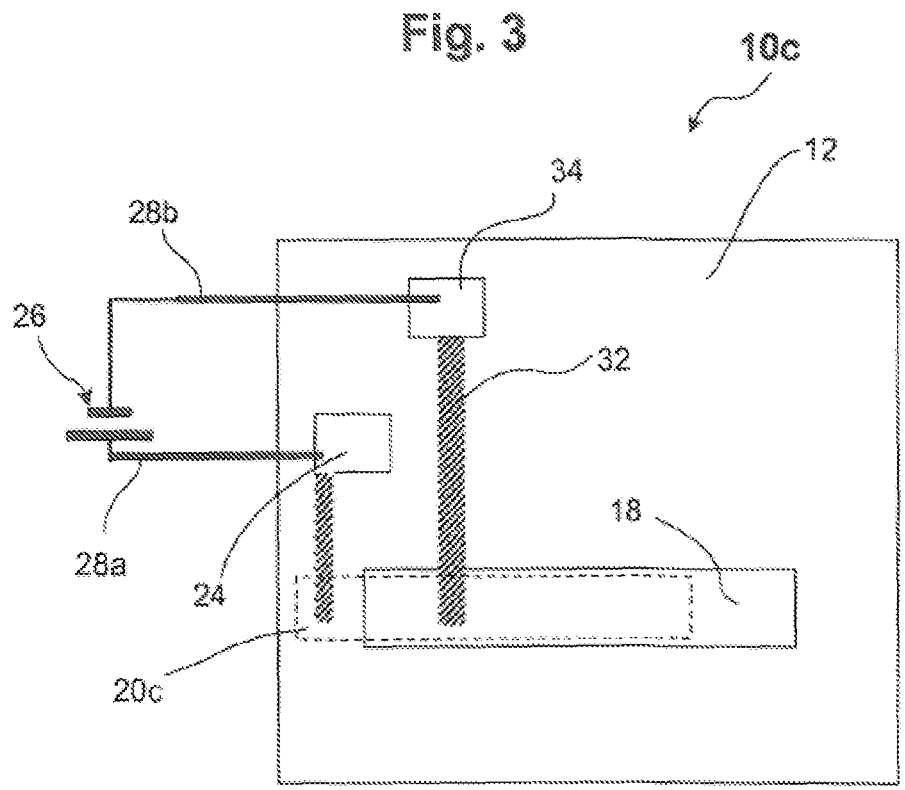

In the embodiment in accordance with FIG. 4, the implantation zone 20c is completely beneath the switching element 18 and extends over a substantial part of its length, wherein a very low impedance resistance is produced. This construction has the advantage that in this way, the shortest switching times are produced.

What is claimed is:

1. A high frequency-MEMS switch comprising:
    a high resistivity substrate provided with an insulator and at least one implantation zone, the insulator being disposed atop the substrate and having an opening, the at least one implantation zone formed in the substrate directly beneath the insulator and in ohmic contact with the substrate, contact with the substrate, a portion of the at least one implantation zone in contact with a signal conductor;
    a bendable switching element having a first end and a movable second end, the first end disposed atop the insulator and in contact with a first contact electrode to supply charge carriers of a first polarity to the switching element, the movable second end extending from the first end over the insulator while bending away from the insulator, wherein the switching element is electrically isolated from the at least one implantation zone by the insulator; and a second contact electrode disposed above the insulator and in contact with another portion of the at least one implantation zone through the opening in the insulator to supply charge carriers of a second polarity to the at least one implantation zone, wherein supply of charge carriers of opposite polarities to the first contact electrode and the second contact electrode produces an electrical field causing an electrostatic bending force on the switching element that bends the second end of the switching element into capacitive coupling with the at least one implantation zone to generate a signal on the signal conductor.

2. The high frequency-MEMS switch according to claim 1, wherein the at least one implantation zone comprises a first implantation zone that is laterally staggered relative to the switching element.

3. The high frequency-MEMS switch according to claim 1, wherein the at least one implantation zone comprises a second implantation zone that is disposed beneath the movable second end of the switching element, the second implantation zone being in contact with the signal conductor.

4. The high frequency-MEMS switch according to claim 1, wherein the at least one implantation zone comprises several implantation zones.

5. The high frequency-MEMS switch according to claim 1, wherein the at least one implantation zone comprises a first implantation zone that ends before the movable second end of the switching element.

6. The high frequency-MEMS switch according to claim 1, wherein the at least one implantation zone comprises a first implantation zone that is laterally completely beneath the switching element and extends along a substantial part of its length.

* * * * *

UNITED STATES PATENT AND TRADEMARK OFFICE
CERTIFICATE OF CORRECTION

PATENT NO. : 8,742,516 B2  
APPLICATION NO. : 13/052699  
DATED : June 3, 2014  
INVENTOR(S) : Ziegler et al.

Page 1 of 1

It is certified that error appears in the above-identified patent and that said Letters Patent is hereby corrected as shown below:

IN THE SPECIFICATION:

Column 2, line 2:

Now reads: "$(1(R \times C))$"

Should read: -- $(1/(R \times C))$ --

IN THE CLAIMS:

Claim 1, Column 4, line 60:

Now reads: "contact with the substrate, contact with the substrate,"

Should read: -- contact with the substrate, --

Signed and Sealed this  
Ninth Day of September, 2014

Michelle K. Lee  
*Deputy Director of the United States Patent and Trademark Office*